United States Patent
Kepkep et al.

(10) Patent No.: US 10,110,237 B2
(45) Date of Patent: Oct. 23, 2018

(54) SYSTEM AND A METHOD FOR DETECTING LOSS OF PHASE LOCK

(71) Applicant: ASELSAN ELEKTRONIK SANAYI VE TICARET A.S., Ankara (TR)

(72) Inventors: Asim Kepkep, Istanbul (TR); Emre Apaydin, Istanbul (TR)

(73) Assignee: ASELSAN ELEKTRONIK SANAYI VE TICARET A.S., Ankara (TR)

(*) Notice: Subject to any disclaimer, the term of this patent is extended or adjusted under 35 U.S.C. 154(b) by 0 days.

(21) Appl. No.: 15/628,335

(22) Filed: Jun. 20, 2017

(65) Prior Publication Data

US 2018/0054207 A1   Feb. 22, 2018

(30) Foreign Application Priority Data

Aug. 19, 2016  (EP) ..................... 16184848

(51) Int. Cl.
| | |
|---|---|
| H03L 7/095 | (2006.01) |
| H03L 7/07 | (2006.01) |
| H03L 7/08 | (2006.01) |
| H03L 7/097 | (2006.01) |

(52) U.S. Cl.
CPC ............. H03L 7/095 (2013.01); H03L 7/07 (2013.01); H03L 7/0805 (2013.01); H03L 7/097 (2013.01)

(58) Field of Classification Search
USPC ................. 375/260; 327/156, 292
See application file for complete search history.

(56) References Cited

U.S. PATENT DOCUMENTS

| | | | | |
|---|---|---|---|---|
| 6,407,682 B1* | 6/2002 | Jones | .................... | H03L 7/0805 341/100 |
| 2003/0034820 A1* | 2/2003 | Starr | ........................ | G06F 1/08 327/292 |
| 2003/0219040 A1* | 11/2003 | Kim | ...................... | H04J 3/0608 370/503 |
| 2005/0242852 A1* | 11/2005 | Parker | ...................... | H03L 7/08 327/156 |
| 2007/0262891 A1* | 11/2007 | Woodral | ............. | G06F 13/4217 341/51 |
| 2017/0322588 A1* | 11/2017 | Lillestolen | ................ | G06F 1/14 |

* cited by examiner

*Primary Examiner* — Eva Puente
(74) *Attorney, Agent, or Firm* — Notaro, Michalos & Zaccaria P.C.

(57) ABSTRACT

A detection system and a detection method for detecting the loss of lock between a PLL reference clock signal and a PLL feedback clock signal. The detection system includes a pseudorandom bit sequence generator; a first shift register; a second shift register; a third shift register; a first synchronizer; a second synchronizer; a third synchronizer; a first comparator; a second comparator; and an alarm control unit. The method comprises the steps of, generating an n-bit wide pseudorandom bit sequence; sampling the sequence with PLL reference clock signal, PLL feedback clock signal and inverse of PLL feedback clock signal; re-sampling and re-synchronizing the sampled sequences; comparing re-sampled and re-synchronized sequence, previously sampled with PLL reference clock signal, with re-sampled and re-synchronized sequences, previously sampled PLL feedback clock signal and inverse of PLL feedback clock signal; generating a flag signal if the comparisons give no match.

8 Claims, 2 Drawing Sheets

SYSTEM AND A METHOD FOR DETECTING LOSS OF PHASE LOCK

TECHNICAL FIELD

Present invention is related to a system and a method for detecting the loss of lock in the phase locked loop frequency synthesizers.

PRIOR ART

Frequency synthesizers, such as phase locked loop (PLL) circuits, are used for generating an output signal whose phase and frequency are related to the phase and frequency of an input signal. In PLL circuits, frequencies of the input signal and output signal are same, wherein there is a predetermined phase relation between said signals.

Design of an LC-Voltage Controlled Oscillator (VCO) that can generate a signal with sufficient power, acceptable jitter and phase noise characteristics as well as a sufficiently wide continuously tunable frequency range over the target process, voltage and temperature (PVT) variations domain is a major challenge. Employing a digitally switched capacitor bank is a frequently utilized method to overcome this challenge. This allows optimal coarse tuning of the VCO to be accomplished by configuring the capacitor bank so that the fine tuning range is nearly centered around the target operating frequency. Even though process variation dependent bank selection may be considered as a static operational parameter, supply voltage and temperature may drift over time causing PLL to lose phase lock and can only be remedied by reconfiguration of the VCO capacitor bank registers. While a conventional lock-detect circuit, one that directly senses the control voltage of the VCO is the most desirable way to ascertain the state of phase lock, this solution requires insertion of additional circuitry to the most sensitive node of the loop. A loss of lock type of detector however can be implemented in digital domain outside the sensitive analog core of the loop. Such a device can be used to alert a supervising controller to intervene in case the phase lock is lost, and rearrange coarse tuning banks if necessary. As certain applications utilize an array arrangement, potentially employing tens of PLLs working simultaneously, maintaining a proper phase relation between array elements is a crucial operational requirement for the proper operation of the system. As a result system operator needs to determine whether a "loss of lock" event took place during the operation.

In the known art, different methods are used for detecting the loss of lock situation in PLL circuits. For example, patent document US2006038595A1 discloses a digital lock detector for detecting whether an output clock is locked to a reference clock. According to this document, a phase sampler compares the phases of the PLL output clock, a delayed PLL output clock and either the reference clock or a delayed reference clock. When the phase of the reference clock or delayed reference clock is between the phases of the PLL output clock and the delayed PLL output clock, the PLL output clock is also locked to the phase of the reference clock.

BRIEF DESCRIPTION OF THE INVENTION

With present invention, a detection system and a detection method for detecting the loss of lock between a PLL reference clock signal and a PLL feedback clock signal are provided. Said detection system comprises, at least one pseudorandom bit sequence generator that generates an n-bit wide pseudorandom bit sequence using said PLL reference clock signal; at least one first shift register, which samples the generated n-bit wide pseudorandom bit sequence by said PLL reference clock signal; at least one second shift register, which samples the generated n-bit wide pseudorandom bit sequence by said PLL feedback clock signal; at least one third shift register, which samples the generated n-bit wide pseudorandom bit sequence by the inverse of said PLL feedback clock signal; at least one first synchronizer that re-samples and re-synchronizes output of first shift register with the PLL reference clock signal; at least one second synchronizer that re-samples and re-synchronizes output of second shift register with the PLL reference clock signal; at least one third synchronizer that re-samples and re-synchronizes output of third shift register with the PLL reference clock signal; at least one first comparator that bit-wise compares output of the first synchronizer with the output of the second synchronizer; at least one second comparator that bit-wise compares output of the first synchronizer with the output of the third synchronizer; at least one alarm control unit that generate a flag signal if said first comparator and second comparator indicates that output of the first synchronizer is not a replica of output of the second synchronizer or output of the third synchronizer.

Said detection method comprises the steps of, generating an n-bit wide pseudorandom bit sequence using said PLL reference clock signal; sampling the generated n-bit wide pseudorandom bit sequence with said PLL reference clock signal by a first shift register; sampling the generated n-bit wide pseudorandom bit sequence with said PLL feedback clock signal by a second shift register; sampling the generated n-bit wide pseudorandom bit sequence with the inverse of said PLL feedback clock signal by a third shift register; re-sampling and re-synchronizing the output of first shift register with the PLL reference clock signal by a first synchronizer; re-sampling and re-synchronizing the output of second shift register with the PLL reference clock signal by a second synchronizer; re-sampling and re-synchronizing the output of third shift register with the PLL reference clock signal by a third synchronizer; bit-wise comparing output of the first synchronizer with the output of the second synchronizer by a first comparator; bit-wise comparing output of the first synchronizer with the output of the third synchronizer by a second comparator; generating a flag signal by an alarm control unit if output of the first synchronizer is not a replica of output of the second synchronizer or output of the third synchronizer.

According to the present application, n-bit wide pseudorandom bit sequence, which is generated with PLL reference clock signal, is sampled not only with PLL reference clock signal and PLL feedback clock signal but also inverse of PLL reference clock signal. Therefore, it is guaranteed that n-bit wide pseudorandom bit sequence is sampled with correct signal in order to detect loss of lock situation between PLL reference clock signal and PLL feedback clock signal.

OBJECT OF THE INVENTION

The main object of the present invention is to provide a system and a method for detecting the loss of lock in the phase locked loop frequency synthesizers.

Another object of the present invention is to provide a system and a method suitable for being used all-digital systems.

Another object of the present invention is to provide an accurate system and method with low false detection.

DETECTION SYSTEM (S)

Figure 1:
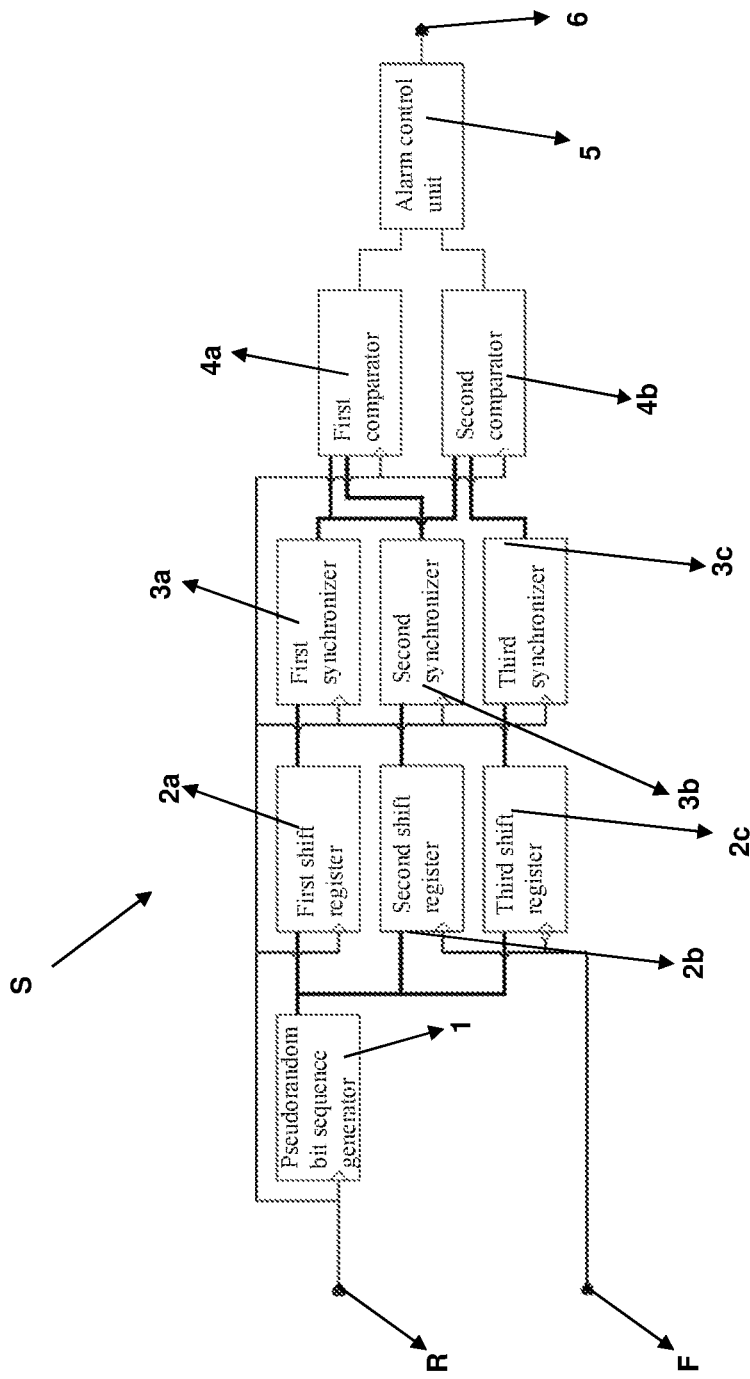
FIG. 1 shows a block diagram of detection system of the present application.

PLL reference clock signal (R)
PLL feedback clock signal (F)
Pseudorandom bit sequence generator (1)
First shift register (2a)
Second shift register (2b)
Third shift register (2c)
First synchronizer (3a)
Second synchronizer (3b)
Third synchronizer (3c)
First comparator (4a)
Second comparator (4b)
Alarm control unit (5)
Flag signal (6)
Fourth shift register (7)

DETAILED DESCRIPTION OF THE INVENTION

In order to generate an output signal whose phase and frequency are related to the phase and frequency of an input signal, phase locked loop (PLL) circuits are used. In the LC Voltage Controlled Oscillators, because of the change of the supply voltage and temperature, phase lock of the PLL may be lost. For that reason, a detection system and a detection method for detecting the loss of lock in the phase locked loop frequency synthesizers are provided with the present invention.

Figure 2:
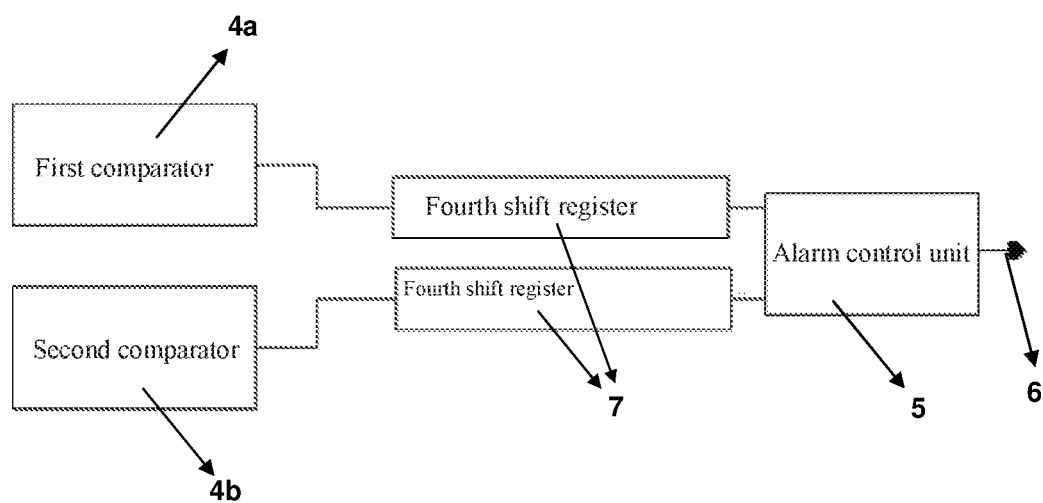
FIG. 2 shows a block diagram of false alarm reduction embodiment of the present application.

Exemplary embodiments of the detection system (S), which detects the loss of lock between a PLL reference clock signal (R) and a PLL feedback clock signal (F), of the present invention are given in FIGS. 1 and 2. Said detection system (S) comprises at least one pseudorandom bit sequence generator (1) that generates an n-bit wide pseudorandom bit sequence using said PLL reference clock signal (R); at least one first shift register (2a), which samples the generated n-bit wide pseudorandom bit sequence by said PLL reference clock signal (R); at least one second shift register (2b), which samples the generated n-bit wide pseudorandom bit sequence by said PLL feedback clock signal (F); at least one third shift register (2c), which samples the generated n-bit wide pseudorandom bit sequence by the inverse of said PLL feedback clock signal (F); at least one first synchronizer (3a) that re-samples and re-synchronizes output of first shift register (2a) with the PLL reference clock signal (R); at least one second synchronizer (3b) that re-samples and re-synchronizes output of second shift register (2b) with the PLL reference clock signal (R); at least one third synchronizer (3c) that re-samples and re-synchronizes output of third shift register (2c) with the PLL reference clock signal (R); at least one first comparator (4a) that bit-wise compares output of the first synchronizer (3a) with the output of the second synchronizer (3b); at least one second comparator (4b) that bit-wise compares output of the first synchronizer (3a) with the output of the third synchronizer (3c); at least one alarm control unit (5) that generate a flag signal (6) if said first comparator (4a) and second comparator (4b) indicates that output of the first synchronizer (3a) is not a replica of output of the second synchronizer (3b) or output of the third synchronizer (3c).

Detection method, which detects the loss of lock between a PLL reference clock signal (R) and a PLL feedback clock signal (F), of the present application comprises the steps of, generating an n-bit wide pseudorandom bit sequence using said PLL reference clock signal (R); sampling the generated n-bit wide pseudorandom bit sequence with said PLL reference clock signal (R) by a first shift register (2a); sampling the generated n-bit wide pseudorandom bit sequence with said PLL feedback clock signal (F) by a second shift register (2b); sampling the generated n-bit wide pseudorandom bit sequence with the inverse of said PLL feedback clock signal (F) by a third shift register (2c); re-sampling and re-synchronizing the output of first shift register (2a) with the PLL reference clock signal (R) by a first synchronizer (3a); re-sampling and re-synchronizing the output of second shift register (2b) with the PLL reference clock signal (R) by a second synchronizer (3b); re-sampling and re-synchronizing the output of third shift register (2c) with the PLL reference clock signal (R) by a third synchronizer (3c); bit-wise comparing output of the first synchronizer (3a) with the output of the second synchronizer (3b) by a first comparator (4a); bit-wise comparing output of the first synchronizer (3a) with the output of the third synchronizer (3c) by a second comparator (4b); generating a flag signal (6) by an alarm control unit (5) if output of the first synchronizer (3a) is not a replica of output of the second synchronizer (3b) or output of the third synchronizer (3c).

In Voltage Controlled Oscillators, routing delay variations from phase frequency detector input, where phase alignment is being forced by the loop, to the location of the detector circuit cannot be known. Therefore, and time difference created between the PLL reference clock signal (R) and the PLL feedback clock signal (F) may cause setup/hold time violations at the first flip-flop of the shift registers. In order to overcome said problem, according to the detection system (S) and detection method of the present application, n-bit wide pseudorandom bit sequence is sampled with both PLL feedback clock signal (F) and inverse of the PLL feedback clock signal (F). Therefore, it is guaranteed that n-bit wide pseudorandom bit sequence is sampled correctly either by PLL feedback clock signal (F) or inverse of PLL feedback clock signal (F).

In an exemplary embodiment of the present invention, depths of first shift register (2a), second shift register (2b) and third shift register (2c) are equal and preferably at least three. By choosing said depth at least three, metastability related uncertainty is minimized.

In a preferred embodiment of the present application, detection system (S) comprises at least two fourth shift registers (7), at least one of which m-samples output of the first comparator (4a) and at least one other m-samples output of the second comparator (4b). In this embodiment, said alarm control unit (5) generates flag signal (6) if all m-samples of the first comparator (4a) and second comparator (4b) indicates a mismatch. Therefore, according to this embodiment, false detection situations are able to be prevented and more reliable detection is able to be provided.

According to the present application, n-bit wide pseudorandom bit sequence, which is generated with PLL reference clock signal (R), is sampled not only with PLL reference clock signal (R) and PLL feedback clock signal (F) but also inverse of PLL reference clock signal (R). Therefore, it is guaranteed that n-bit wide pseudorandom bit sequence is sampled with correct signal in order to detect loss of lock situation between PLL reference clock signal (R) and PLL feedback clock signal (F).

The invention claimed is:

1. A detection system (S) for detecting the loss of lock between a PLL reference clock signal (R) and a PLL feedback clock signal (F), characterized by comprising;
   - at least one pseudorandom bit sequence generator (1) that generates an n-bit wide pseudorandom bit sequence using said PLL reference clock signal (R), wherein n is an integer greater than one;
   - at least one first shift register (2a), which samples the generated n-bit wide pseudorandom bit sequence by said PLL reference clock signal (R);
   - at least one second shift register (2b), which samples the generated n-bit wide pseudorandom bit sequence by said PLL feedback clock signal (F);
   - at least one third shift register (2c), which samples the generated n-bit wide pseudorandom bit sequence by the inverse of said PLL feedback clock signal (F);
   - at least one first synchronizer (3a) that re-samples and re-synchronizes output of first shift register (2a) with the PLL reference clock signal (R);
   - at least one second synchronizer (3b) that re-samples and re-synchronizes output of second shift register (2b) with the PLL reference clock signal (R);
   - at least one third synchronizer (3c) that re-samples and re-synchronizes output of third shift register (2c) with the PLL reference clock signal (R);
   - at least one first comparator (4a) that bit-wise compares output of the first synchronizer (3a) with the output of the second synchronizer (3b);
   - at least one second comparator (4b) that bit-wise compares output of the first synchronizer (3a) with the output of the third synchronizer (3c);
   - at least one alarm control unit (5) that generate a flag signal (6) if said first comparator (4a) and second comparator (4b) indicates that output of the first synchronizer (3a) is not a replica of output of the second synchronizer (3b) or output of the third synchronizer (3c).

2. A detection system (S) according to claim 1, characterized in that; depths of first shift register (2a), second shift register (2b) and third shift register (2c) are equal.

3. A detection system (S) according to claim 2, characterized in that; depths of first shift register (2a), second shift register (2b) and third shift register (2c) are at least three.

4. A detection system (S) according to claim 1, characterized by further comprising; at least two fourth shift registers (7), at least one of which m-samples output of the first comparator (4a) and at least one other m-samples output of the second comparator (4b).

5. A detection method for detecting the loss of lock between a PLL reference clock signal (R) and a PLL feedback clock signal (F), characterized by comprising the steps of;
   - generating an n-bit wide pseudorandom bit sequence using said PLL reference clock signal (R), wherein n is an integer greater than one;
   - sampling the generated n-bit wide pseudorandom bit sequence with said PLL reference clock signal (R) by a first shift register (2a);
   - sampling the generated n-bit wide pseudorandom bit sequence with said PLL feedback clock signal (F) by a second shift register (2b);
   - sampling the generated n-bit wide pseudorandom bit sequence with the inverse of said PLL feedback clock signal (F) by a third shift register (2c);
   - re-sampling and re-synchronizing the output of first shift register (2a) with the PLL reference clock signal (R) by a first synchronizer (3a);
   - re-sampling and re-synchronizing the output of second shift register (2b) with the PLL reference clock signal (R) by a second synchronizer (3b);
   - re-sampling and re-synchronizing the output of third shift register (2c) with the PLL reference clock signal (R) by a third synchronizer (3c);
   - bit-wise comparing output of the first synchronizer (3a) with the output of the second synchronizer (3b) by a first comparator (4a);
   - bit-wise comparing output of the first synchronizer (3a) with the output of the third synchronizer (3c) by a second comparator (4b);
   - generating a flag signal (6) by an alarm control unit (5) if output of the first synchronizer (3a) is not a replica of output of the second synchronizer (3b) or output of the third synchronizer (3c).

6. A detection method according to claim 5, characterized in that; depths of first shift register (2a), second shift register (2b) and third shift register (2c) are equal.

7. A detection method according to claim 6, characterized in that; depths of first shift register (2a), second shift register (2b) and third shift register (2c) are at least three.

8. A detection method according to claim 5, characterized in that; output of the first comparator (4a) and output of the second comparator (4b) are m-sampled and said flag signal (6) is generated, if all m-samples of the first comparator (4a) and second comparator (4b) indicates a mismatch.

* * * * *